United States Patent [19]

Peterson

[11] Patent Number: 5,571,740

[45] Date of Patent: *Nov. 5, 1996

[54] METHOD OF MAKING A CAPPED MODULAR MICROWAVE INTEGRATED CIRCUIT

[75] Inventor: Robert K. Peterson, Garland, Tex.

[73] Assignee: Texas Instruments Incorporated, Dallas, Tex.

[*] Notice: The term of this patent shall not extend beyond the expiration date of Pat. No. 5,376,574.

[21] Appl. No.: 299,787

[22] Filed: Sep. 1, 1994

Related U.S. Application Data

[63] Continuation of Ser. No. 99,350, Jul. 30, 1993, Pat. No. 5,376,574.

[51] Int. Cl.$^6$ ................................................ H01L 21/70
[52] U.S. Cl. ................................ 437/51; 437/50; 437/184
[58] Field of Search .......................... 437/5, 51, 184, 437/180, 229, 974, 47, 60

[56] References Cited

U.S. PATENT DOCUMENTS

| | | | |
|---|---|---|---|
| 4,492,717 | 1/1985 | Pliskin et al. | 437/229 |
| 5,102,822 | 4/1992 | Calligaro | 437/904 |
| 5,151,769 | 9/1992 | Immorlica, Jr. et al. | 357/53 |
| 5,162,258 | 11/1992 | Lemnios et al. | 437/184 |
| 5,171,712 | 12/1992 | Wang et al. | 437/974 |
| 5,182,233 | 1/1993 | Inoue | 437/226 |
| 5,376,574 | 12/1994 | Peterson | 437/51 |

FOREIGN PATENT DOCUMENTS

| | | |
|---|---|---|
| 58-092270 | 6/1983 | Japan . |
| 62-073758 | 4/1987 | Japan . |

OTHER PUBLICATIONS

"Multilayer MMIC Using a 3μ×3Layer Dielectric Film Structure", Tsuneo Tokumitsu, IEEE MTT-S International Microwave Symposium digest, vol. II, 1990, pp. 831–834.

Primary Examiner—George Fourson
Assistant Examiner—S. Mulpuri
Attorney, Agent, or Firm—Reneé E. Grossman; Richard L. Donaldson

[57] ABSTRACT

A capped MMIC and method of making same wherein a polymer layer cast over the surface of a semiconductor wafer and vias are formed in the polymer layer down to the wafer surface. The exposed surface of the polymer layer is then metallized and etched in a predetermined pattern to provide a metal pattern over the upper surface of the polymer layer which extends into the vias and to the surface of the wafer. Pads of the metallization are also provided on the upper surface of the polymer layer which are individually electrically isolated from the remainder of the metallization. The wafer is now ground back and backside metallization and other desired processing then takes place in standard manner to complete fabrication of the individual MMICs on the wafer. The MMICs are then diced in standard manner. The MMICs can be secured in a housing fabricated of ceramic or metal. The housing has a plurality of cavities, each cavity for receipt of a MMIC or MMICs. A ground plane is provided along the surface of the housing by plating or the like, if the housing is ceramic (the housing can be its own ground plane if electrically conductive), this ground plane being coupled to the metallization on the MMIC to provide a continuous ground plane along the top surface of the housing with pads on the surface of the MMIC electrically isolated from the ground plane. A multilayer circuit can be fabricated over the ground plane layer and can contain passive elements thereon, such as couplers, filters, transmission lines and the like which are coupled through vias therein to pads on the MMICs.

7 Claims, 1 Drawing Sheet

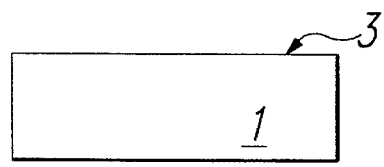
Fig. 1a
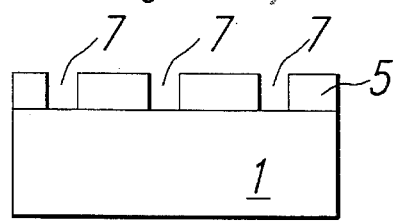
Fig. 1b
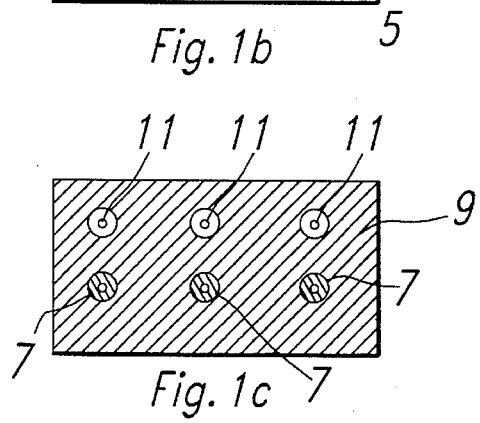
Fig. 1c
Fig. 1d
Fig. 1e
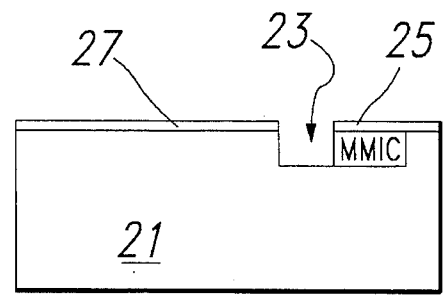
Fig. 3
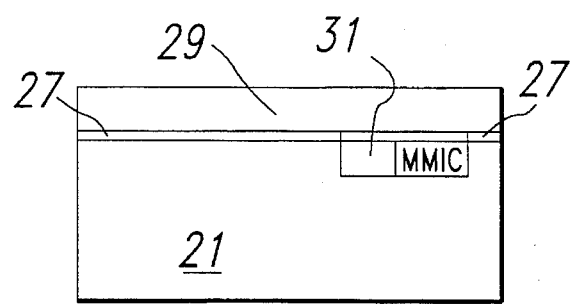
Fig. 4
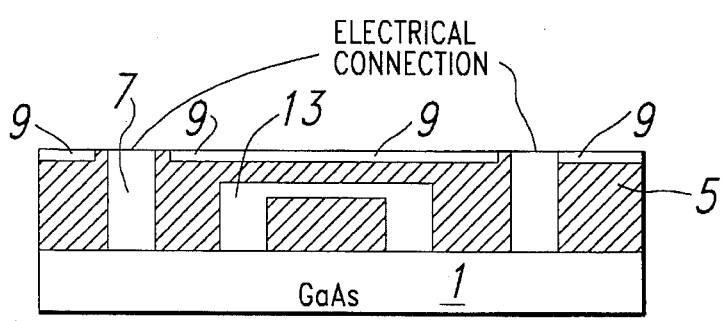
Fig. 2

METHOD OF MAKING A CAPPED MODULAR MICROWAVE INTEGRATED CIRCUIT

This is a continuation of application Ser. No. 08/099,350 filed Jul. 30. 1993, U.S. Pat. No. 5,376,574.

BACKGROUND OF THE INVENTION

1. Field of the Invention

This invention relates to a capped modular microwave integrated circuit (MMIC) and a method of fabrication thereof.

2. Brief Description of the Prior Art

Gallium arsenide MMICs are conventionally designed for use in an open cavity and with a perimeter wire bond interface. This type of interface limits microwave performance because of the parasitic effects of the wire interface and the coupling effects of the open cavity. Thus, the currently used MMIC crossover techniques have an effect on device performance. Packaging metrics for size and weight are limited because of the space required for the wires and the cavity. Also, the design of the MMIC to create an edge interface requires increased MMIC size.

In general, prior art gallium arsenide processing for high frequency (about 10 GHz) applications started with a wafer having a thickness of about 25 mils with normal processing taking place on a surface thereof. The wafer is then ground back, generally to a thickness of about four mils. Backside processing then takes place including the etching of vias and metallization of the backside of the wafer. The wafer is then diced to provide the finished parts. A problem with these parts is that they now have a thickness of about 4 mils, it being known that gallium arsenide is not a strong material and is a poor thermal conductor. It is therefore easy to chip or break the parts during further handling and/or processing and there is also a thermal penalty imposed due to the thickness of gallium arsenide. This also impedes the use of even thinner gallium arsenide chips and the benefits that can be derived therefrom.

One prior art approach known as high density interconnect (HDI) eliminates bond wires. This concept uses MMICs that are mounted face up in a pocketed base to create a planar surface. A multilayer circuit is manufactured with direct interface to the MMICs. The circuit is ablated in the area of the circuit over the active zones of the MMIC. The packaging is completed with an enclosure to create a cavity. This concept achieves improved MMIC interface performance. Coupling within the cavity as well as size and weight are also reduced. MMIC redesign is not required for this approach. However, this concept is still in an open cavity and therefore has electromagnetic fields disposed above the open cavity.

A further prior art approach involves the use flip chip technology to eliminate bond wires. This concept uses MMICs that are mounted upside down on a multilayer circuit, such as low temperature ceramic cofire (LTCC). The MMIC is redesigned with a coplanar waveguide topology to accommodate the effects of the adjacent substrate. The packaging is completed with an enclosure to create a hermetic cavity. This concept has thermal limitations. The redesigned MMICs are not restricted to perimeter interface and can be reduced in size and have improved power and microwave interfaces. Coupling within the cavity as well as size and weight are reduced.

SUMMARY OF THE INVENTION

In accordance with the present invention, an improved MMIC package is provided to create a field enclosing dielectric cavity over the MMIC. The MMIC is redesigned to accommodate a dielectric layer and top ground plane over the device which is required for the change in dielectric constant above the active surface of the MMIC. This creates a field-containing enclosure for the MMIC. Interface pads are extended from the surface of the MMIC to isolated pads in the top ground plane with vias. The isolated pads in the top ground plane can be placed at the optimum point on the device for power, ground, control and microwave functions. Crossovers can be created in the dielectric cavity using multilayer circuit techniques. Devices can be designed with an area pad array for HDI and flip chip applications or for a perimeter pad interface.

The MMIC enclosure can be manufactured using multilayer circuit techniques described in Ser. No. 07/897,174, filed Jun. 11, 1992 (TI-15786), the contents of which are incorporated herein by reference. The polymer selected for use must be curable at temperatures below 300° C. for MMIC compatibility.

A manufacturing concept to create the envelope or field-containing enclosure employs an additive segmented multilayer circuit technology, though other techniques are possible. A gallium arsenide wafer that has been designed for incorporation of the enclosure is processed top side to completeness. A multilayer RF interconnect is manufactured to create the enclosure. The wafer is then back side processed and diced. The polymer that is chosen must be curable at temperatures below 300° C. and must survive assembly process temperatures. Cyanate ester is a preferred polymer.

The invention includes a standard wafer in which a plurality of MMICs will be simultaneously processed. Processing takes place in standard manner on a surface of the wafer to form plural MMICs therein. A polymer, preferably a cyanate, ester layer of from about 3 to about 15 mils and preferably about 10 mils is then cast over the surface and vias are formed in the polymer layer down to the wafer surface. The exposed surface of the polymer layer is then metallized, preferably with gold having a Ti/Ni adhesion promote and etched in a predetermined pattern to provide a metal pattern over the upper surface of the polymer layer which extends into the vias and to the surface of the wafer. Pads of the metallization are also provided on the upper surface of the polymer layer which are individually electrically isolated from the remainder of the metallization. All isolated pads attach to functional MMIC pads through vias, the remainder of the surface being ground.

The wafer is now ground back to a thickness of about 4 mils or even less. Backside metallization and other desired processing then takes place in standard manner to complete fabrication of the individual MMICs on the wafer. The MMICs are then diced in standard manner, such as sawing.

The MMICs can be secured in a housing fabricated of ceramic or metal, each type of housing having its own advantages, having a coefficient of thermal expansion reasonably matched to the MMIC in the event the MMIC is to be soldered to the housing. If the MMIC is to be secured to the housing by an epoxy, a greater degree of CTE mismatch can be tolerated. The housing has a plurality of cavities, each cavity for receipt of a MMIC or MMICs. A ground plane is provided along the surface of the housing, such as by copper, if the housing is ceramic (the housing can be its own ground plane if electrically conductive), this ground plane being coupled to the metallization on the MMIC to provide a continuous ground plane along the top surface of the housing with pads on the surface of the MMIC electrically isolated from the ground plane. A layer of the multilayer circuit can be secured to the ground plane layer and can contain passive elements thereon, such as couplers, filters, transmission lines and the like which are coupled through vias therein to pads on the MMICs.

The resulting structure provides an isolated, testable MMIC having more isolated crossovers and package interference than the prior art. Passive devices can be packaged and interconnects can be routed over the MMICs. There is also a size reduction, an improved power interface and improved MMIC performance due to smaller pads at the active surface.

BRIEF DESCRIPTION OF THE DRAWING

FIG. 1a is a cross sectional view of a wafer to be fabricated in accordance with the present invention;

FIG. 1b is a cross sectional view of a partially fabricated wafer in accordance with the present invention;

FIG. 1c is a top view of a still further partially fabricated wafer in accordance with the present invention;

FIGS. 1d and 1e show the MMIC in accordance with the present invention at more advanced stages of processing;

FIG. 2 is a cross sectional view of a completed MMIC in accordance with the present invention;

FIG. 3 is a cross sectional view of a housing containing plural MMICs of the present invention in cavities therein; and FIG. 4 is a cross sectional view of a housing as in FIG. 3 with a layer thereover containing passive elements for interconnection with MMICs within the housing.

DESCRIPTION OF THE PREFERRED EMBODIMENT

Referring now to FIG. 1a, there is shown a standard wafer 1 having a thickness of about 25 mils. A plurality of MMICs will be simultaneously processed on and in the wafer 1 as is well known. However, only one of the MMICs will be described hereinbelow.

Top side processing takes place in standard manner on the surface 3 of wafer i to form plural MMICs in the wafer. A ten mil thick polymer layer 5 is then cast over the surface 3 and vias 7 and 11 are formed by laser drill or reactive ion etch in the polymer layer down to the surface 3 of the wafer 1 as shown in FIG. 1b. The polymer layer 5 is a blend of polymer and filler to match the coefficient of thermal expansion of GaAs, such as, for example, silicon in a cyanate ester. The exposed upper surface of the polymer layer 5 is then metallized with metal, preferably gold, and etched in a predetermined pattern to provide a metal pattern 9 over the upper surface of the polymer layer which extends into the vias 7 and to the surface 3 of the wafer 1 as well. Vias 7 attach to ground pads on the MMIC. Pads 11 of the metallization 9 are also provided in standard manner on the upper surface of the polymer layer, pads 11 being individually electrically isolated from the remainder of the metallization 9 as shown in FIG. 1c.

The wafer 1 is now ground back as in the prior art to a thickness of about 4 mils, the removed portion of the wafer being shown in phantom in FIG. 1d. However, it should be understood that the wafer could be ground back even more than to the 4 mils of the prior art since there is now a structure which includes the ten mils of polymer. Backside metallization 13 and other desired backside processing then takes place in standard manner to complete fabrication of the individual MMICs on the wafer as shown in FIG. 1e. The MMICs are then diced in standard saw or other manner.

FIG. 2 shows a completed MMIC in accordance with the present invention which includes the gallium arsenide die 1 with fabricated components therein. The polymer layer 5 is disposed on the die 1 with vias 7 therein containing the metallization 9, the metallization also extending over the upper surface of the polymer layer. A crossover 15 interconnecting the metallization in adjacent vias is also shown. This embodiment is fabricated in the same manner as discussed above with regard to FIG. 1 except that during build up of the polymer layer 5, such build up is stopped, the entire surface is masked, metallization is deposited on the unmasked portion of the polymer layer and polymer buildup then continues.

Referring now to FIG. 3, there is shown a system for housing the MMICs fabricated in the manner described hereinabove. The system includes a housing 21 fabricated of ceramic, preferably aluminum oxide, or metal, preferably Kovar, and having a coefficient of thermal expansion (CTE) reasonably matched to the MMIC in the event the MMIC is to be soldered to the housing. If the MMIC is to be secured to the housing by a polymer, a greater degree of CTE mismatch can be tolerated. The housing 21 further has a plurality of cavities 23 therein, each cavity for receipt of a MMIC or MMICs 25 therein. A ground plane 27 is provided along the upper surface of the housing 21 in standard manner, such as by metallizing the ceramic with gold, if the housing is ceramic (the housing can be its own ground plane if electrically conductive). This ground plane is coupled to the metallization 9 on the MMIC 25 by filling the remainder of the cavity with a CTE matched polymer 31 and then metallizing the surface 27 of the housing and the ground surface 9 of the MMIC. This ground plane can be established with other interconnect techniques. This provides a continuous ground plane along the top surface of the housing. Accordingly, the top surface of the housing 21 will appear as a continuous ground plane with pads 11 on the surface of the MMIC 25, the pads being electrically isolated from the ground plane.

Referring now to FIG. 4, there is shown a layer 29, which can be a multilayer interconnect, such as polyimide thin film with copper conductors which is manufactured using segmentation technique, which is secured to the ground plane layer 27 and which can contain passive elements thereon, such as couplers, filters, transmission lines and the like. These passive elements are coupled, as required, through vias in the layer 29 (not shown) to pads 11 on the MMICs 25.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of making a shielded monolithic microwave integrated circuit comprising the steps of:

(a) providing a wafer having a first surface containing a monolithic microwave integrated circuit extending to said first surface;

(b) forming an electrically insulating layer on and secured to said first surface, said electrically insulating layer having vias therethrough extending to said first surface said electrically insulating layer having a coefficient of thermal expansion structurally compatible with the coefficient of thermal expansion of said wafer;

(c) forming a ground plane on said electrically insulating layer by providing a layer of metallization disposed on said electrically insulating layer, at least a part of said layer of metallization forming said ground plane to shield a portion of said first surface, at least one portion of said layer of metallization extending to said first surface through said vias;

(d) further including the step of providing an electrical conductor buried in said electrically insulating layer interconnecting the metallization in a pair of vias.

2. The method of claim 1 further including the step of thinning said wafer by removal of a portion of said wafer from the surface opposed to said first surface.

3. The method of claim 2 further including the step of processing said surface opposed to said first surface.

4. The method of claim 3 wherein said step of processing said surface opposed to said first surface comprises metallization.

5. The method of claim 1 wherein said ground plane extends over substantially said entire integrated circuit.

6. The method of claim 2 wherein said step of thinning includes thinning said wafer to a thickness less than 4 mils.

7. The method of claim 1, further including the steps of providing said integrated circuit with a ground pad, and extending said metallization through a said via to a said ground pad.

* * * * *